US 6,727,183 B1

(12) United States Patent
Ma et al.

(10) Patent No.: US 6,727,183 B1
(45) Date of Patent: Apr. 27, 2004

(54) PREVENTION OF SPIKING IN ULTRA LOW DIELECTRIC CONSTANT MATERIAL

(75) Inventors: Ching-Hui Ma, Taiwan (TW); Jen-Cheng Liu, Chia-yi (TW); Li-Chih Chao, Yang-Mei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 148 days.

(21) Appl. No.: 09/915,842

(22) Filed: Jul. 27, 2001

(51) Int. Cl.$^7$ .............................................. H01L 21/302
(52) U.S. Cl. ..................... 438/710; 438/714; 438/723; 438/724
(58) Field of Search ................. 438/706, 710, 438/714, 724, 725, 723

(56) References Cited

U.S. PATENT DOCUMENTS

| 4,563,367 | A | * | 1/1986 | Sherman .................. 427/563 |
| 5,562,801 | A | * | 10/1996 | Nulty ....................... 438/695 |
| 5,632,855 | A | * | 5/1997 | Jones et al. .............. 438/714 |
| 6,009,830 | A | * | 1/2000 | Li et al. .................. 118/723 R |
| 6,013,582 | A | * | 1/2000 | Ionov et al. .............. 438/738 |
| 6,096,655 | A | | 8/2000 | Lee et al. ................. 438/700 |
| 6,123,862 | A | | 9/2000 | Donohoe et al. .......... 216/17 |
| 6,127,089 | A | | 10/2000 | Subramanian et al. ..... 430/270 |
| 6,156,643 | A | | 12/2000 | Chan et al. ............... 438/638 |
| 6,159,661 | A | | 12/2000 | Huang et al. .............. 430/313 |
| 6,211,092 | B1 | * | 4/2001 | Tang et al. ................ 438/719 |
| 6,291,887 | B1 | * | 9/2001 | Wang et al. ............... 257/758 |
| 6,312,874 | B1 | * | 11/2001 | Chan et al. ............... 430/314 |
| 6,340,435 | B1 | * | 1/2002 | Bjorkman et al. ........... 216/72 |
| 6,380,096 | B2 | * | 4/2002 | Hung et al. ............... 438/723 |
| 6,399,512 | B1 | * | 6/2002 | Blosse et al. ............. 438/723 |

OTHER PUBLICATIONS

Plummer et al. "Silicon VLSI Technology", 2000, Prentice Hall, p. 639.*

* cited by examiner

Primary Examiner—Kin-Chan Chen
(74) Attorney, Agent, or Firm—George O. Saile; Stephen B. Ackerman; Rosemary L. S. Pike

(57) ABSTRACT

A novel etching method for preventing spiking and undercutting of an ultra low-k material layer in damascene metallization is described. A region to be contacted is provided in or on a semiconductor substrate. A liner layer is deposited overlying the region to be contacted. An ultra low-k dielectric layer is deposited overlying the liner layer. A damascene opening is etched through the ultra low-k dielectric layer to the liner layer overlying the region to be contacted wherein this etching comprises a high F/C ratio etch chemistry, high power, and low pressure. The liner layer within the damascene opening is etched away to expose the region to be contacted wherein this etching comprises a high F/C ratio etch chemistry, low power, and low pressure to complete formation of a damascene opening in the fabrication of an integrated circuit device.

29 Claims, 4 Drawing Sheets

PREVENTION OF SPIKING IN ULTRA LOW DIELECTRIC CONSTANT MATERIAL

BACKGROUND OF THE INVENTION (1) Field of the Invention

The invention relates to a method of metallization in the fabrication of integrated circuits, and more particularly, to a method of trench etching that prevents spiking in an ultra low dielectric constant material in the manufacture of integrated circuits.

(2) Description of the Prior Art

In a common application for integrated circuit fabrication, a contact/via opening is etched through an insulating layer to an underlying area to which electrical contact is to be made. A conducting layer material is deposited within the contact/via opening. The damascene and dual damascene processes have become a future trend in metallization. Trenches or vias and trenches are etched in an insulating layer. The trenches or vias and trenches are inlaid with metal to complete the contacts. In order to reduce RC delay to a minimum, low dielectric constant materials are preferably used as the insulating layer. In fact, ultra low dielectric constant.(k) materials are most preferably used. Etch stop layers are often used to accurately form the trenches and vias. For ultra low-k materials (k<2.5), it is very important not to use etch stop layers. If the insulating material has a k value of 2.0, a thin etch stop layer having a k value of about 7.0 will increase the effective k value of the insulating layer to 2.5. Without the etch stop layer, the effective k value is a much more desirable 2.0. However, most of the ultra low-k materials are very porous and have high interstitial doping so that spiking and undercutting happens easily during etching.

FIG. 1A illustrates spiking 25 in the ultra low-k insulating layer 16 during etching of the damascene opening 20 and undercutting 27 at the interface of the low-k film and the etch stop layer, either in the low-k film or in the etch stop layer. This spiking and undercutting will cause k value damage and unwanted diffusion of the metal layer into the insulating layer through the spiking area 25. After cleaning, the damaged ultra low-k film may trap the cleaning solvents, further increasing effective k-value. Because of the spiking and trapped solvents, the subsequently deposited barrier layer does not adhere well to the trench surfaces, thereby allowing the metal layer to diffuse into the porous low-k films.

U.S. Pat. No. 6,123,862 to Donohoe et al discloses an etching process for high aspect ratio openings. U.S. Pat. No. 6,156,643 to Chen et al teaches a dual damascene process. U.S. Pat. Nos. 6,159,661 to Huang et al, 6,096,655 to Lee et al, and 6,127,089 to Subramanian et al show dual damascene processes using low dielectric constant materials.

SUMMARY OF THE INVENTION

A principal object of the present invention is to provide an effective and very manufacturable method of metallization in the fabrication of integrated circuit devices.

Another object of the invention is to provide a method damascene metallization in the fabrication of integrated circuit devices.

A further object of the invention is to provide a method of damascene metallization using ultra low-k materials.

Yet another object of the invention is to provide a method of preventing spiking and undercutting of an ultra low-k material layer in damascene metallization.

Yet another object of the invention is to provide a novel etch recipe for preventing spiking and undercutting of an ultra low-k material layer in damascene metallization.

In accordance with the objects of this invention a novel etching method for preventing spiking and undercutting of an ultra low-k material layer in damascene metallization is achieved. A region to be contacted is provided in or on a semiconductor substrate. A liner layer is deposited overlying the region to be contacted. An ultra low-k dielectric layer is deposited overlying the liner layer. A damascene opening is etched through the ultra low-k dielectric layer to the liner layer overlying the region to be contacted wherein this etching comprises a high F/C ratio etch chemistry, high power, and low pressure. The liner layer within the damascene opening is etched away to expose the region to be contacted wherein this etching comprises a high F/C ratio etch chemistry, low power, and low pressure to complete formation of a damascene opening in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a method for damascene metallization having no spiking or undercutting of the ultra low-k material and having good electrical performance. The novel etch recipe of the present invention removes the damaged layer to prevent undercutting or spiking in the trench.

It will be understood by those skilled in the art that the process of the present invention is not limited to the embodiments described in detail herein, but may be used in any application in which an ultra low-k material layer is to be used.

Figure 2:
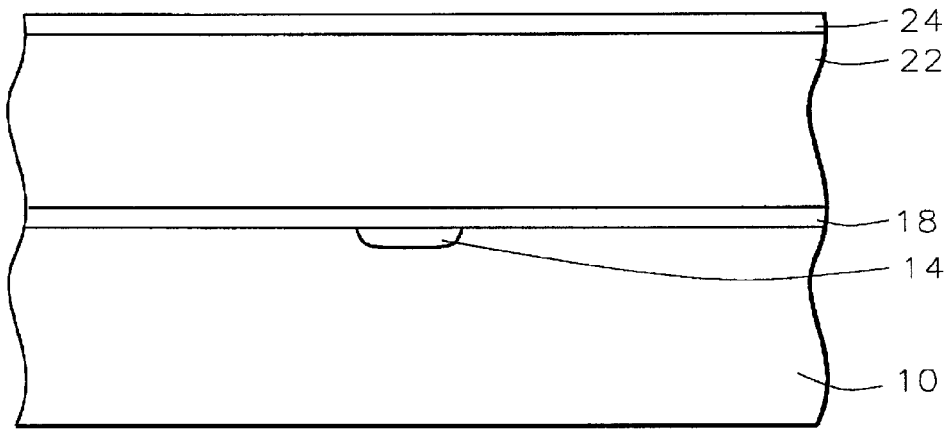
FIGS. 2 through 5 schematically illustrate in cross-sectional representation a preferred embodiment of the present invention.

Referring now more particularly to FIG. 2, there is illustrated a portion of a partially completed integrated circuit device. There is shown a semiconductor substrate 10, preferably composed of monocrystalline silicon. Semiconductor device structures, such as gate electrodes and source and drain regions, not shown, may be formed in and on the semiconductor substrate. These semiconductor device structures are covered with an insulating layer such as silicon oxide. A first layer of metallization may also be provided. The semiconductor device structures and insulating layer thereover are represented by 12 in FIG. 2. 14 is a region to be contacted by the damascene process of the present invention. 14 may be a semiconductor device structure such as a gate electrode or source or drain region or it may be a first metal line, for example. A liner layer 18 may be formed overlying the region 14 to be contacted. The liner layer may comprise silicon nitride or silicon carbide and have a thickness of between about 300 and 700 Angstroms.

Now, an ultra low dielectric constant material 22 is deposited overlying the substrate. For example, the ultra low-k material may be Black Diamond or any organic dielectric material film deposited to a thickness of between about 6000 and 10,000 Angstroms. The ultra low-k material should have a dielectric constant of 2.0 to 3.0 and preferably less than 2.5. An anti-reflective coating (ARC) layer 24 may be deposited over the ultra low-k material layer 22. For example, this may be a silicon oxynitride layer.

The process of the present invention provides a novel etch recipe to etch a trench in the ultra low-k material layer with no spiking or undercutting. A low power process is used to prevent damage of the low-k films during etching. A cleaner or lean etch gas is used in the etching process to prevent etching nonuniformity.

In the trench etch process, there are two reaction modes occurring at the same time: polymer deposition and etching. If cleaner or lean gas (having a high F/C ratio) is used, the etch mode is much greater than the deposition mode. Thus, the trench etching process will avoid the effect of the polymer and be etched very smoothly. On the contrary, if a polymer-rich gas is used, having a lower F/C ratio, the etch mode is only a little greater than the deposition mode. This will result in spiking because of the non-uniformly deposited polymer. A damaged layer is formed at the bottom of a trench during etching. It has been found that using a low power process can reduce the damaged layer formed during etching.

Figure 3:
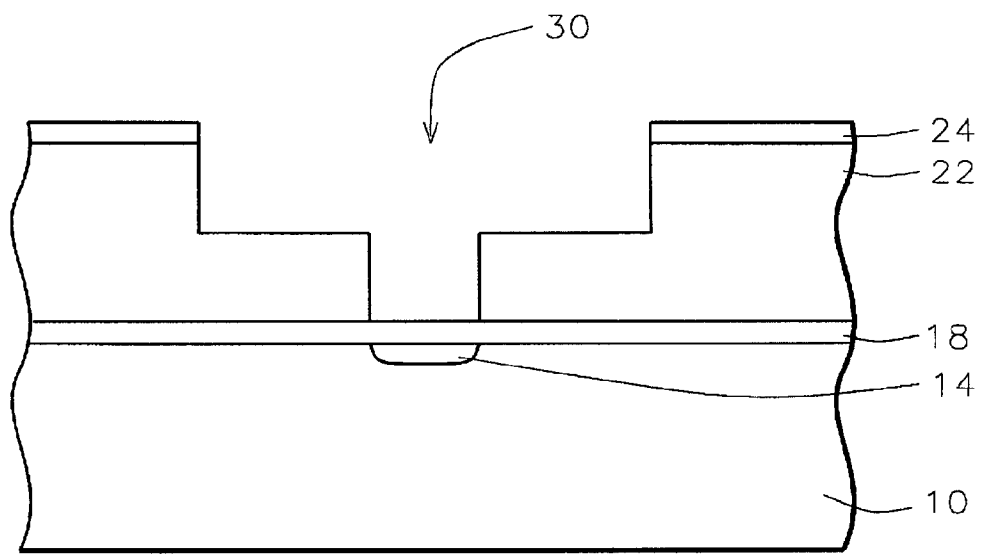

Referring now to FIG. 3, a trench 30 is etched through the ARC layer 24 and the low-k material layer 22 using an etch recipe having high pressure to prevent the ion bombardment effect which would cause spiking of the trench, low power to decrease the physical sputtering effect which would cause spiking of the trench, and a high F/C ratio etch chemistry to remove the damaged layer at the bottom of the trench to prevent spiking and microloading. This may be a single damascene trench, or a dual damascene trench and via as shown in FIG. 3.

Figure 1A:
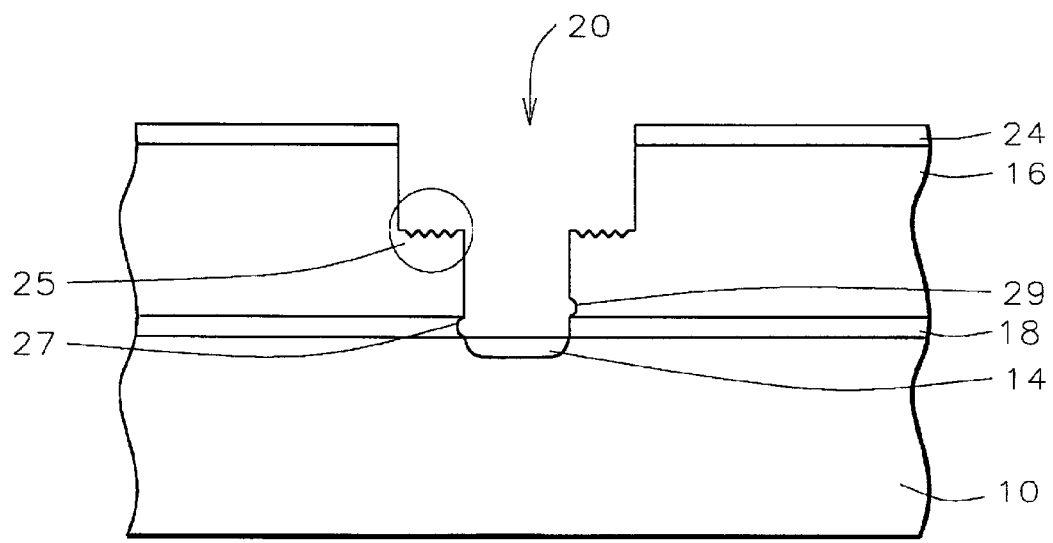
FIGS. 1A, 1B, and 1C schematically illustrate in cross-sectional representation problems of the prior art.
Figure 1B:
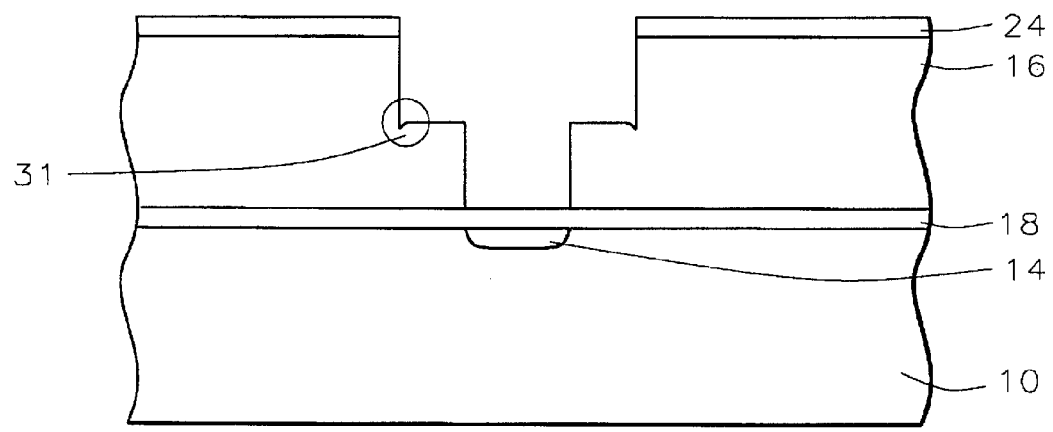
Figure 1C:
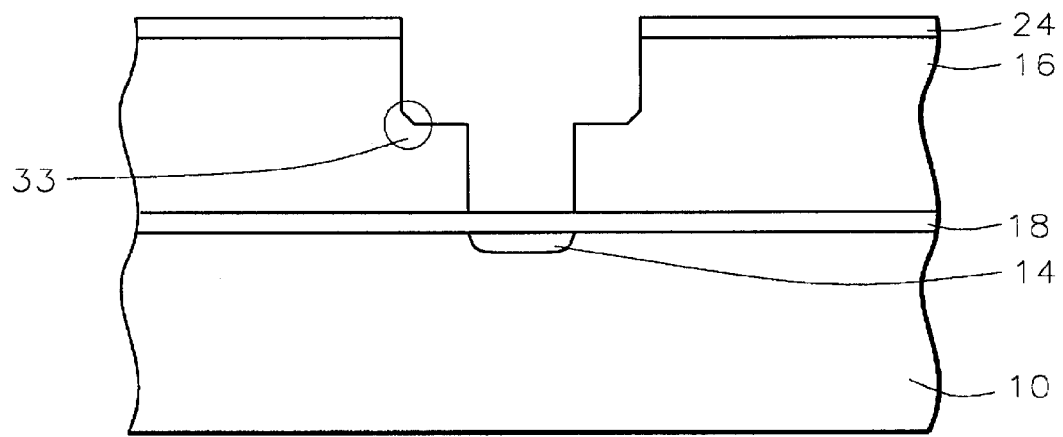
Figure 6:
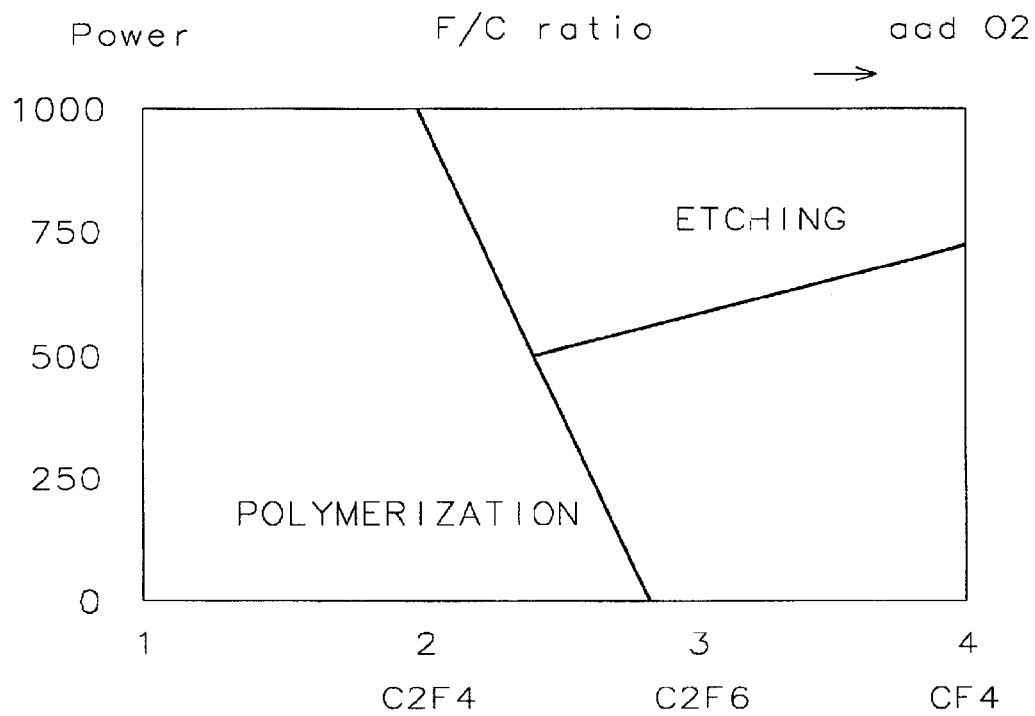
FIG. 6 graphically illustrates the region of gas usage and power of the present invention.

FIG. 6 graphically illustrates the F/C ratio of the etching chemistry along the x-axis and power along the y-axis. $O_2$ is added to each etching gas. High-polymer gases such as $C_4F_8$ and $CH_2F_2$ +$N_2$ (having a F/C ratio of 2) have been found to cause micro-trenching and footing. FIG. 1B illustrates microtrenching 31 and FIG. 1C illustrates footing 33. High polymer gases such as $CH_2F_2$, $C_2F_2$, and $C_2F_6$ have been found to cause spiking. However, low polymer gases such as $CHF_3$ and $CF_4$ have been found not to cause spiking.

More specifically, the trench etching recipe uses the etching gases $CF_4$, $O_2$, and Ar. Preferably, $CF_4$ is flowed at 0 to 150 sccm, $O_2$ is flowed at 0 to 20 sccm, and Ar is flowed at 0 to 300 sccm. Power is held at between about 700 and 1000 watts and pressure is maintained at between about 80 and 150 mTorr.

Figure 4:
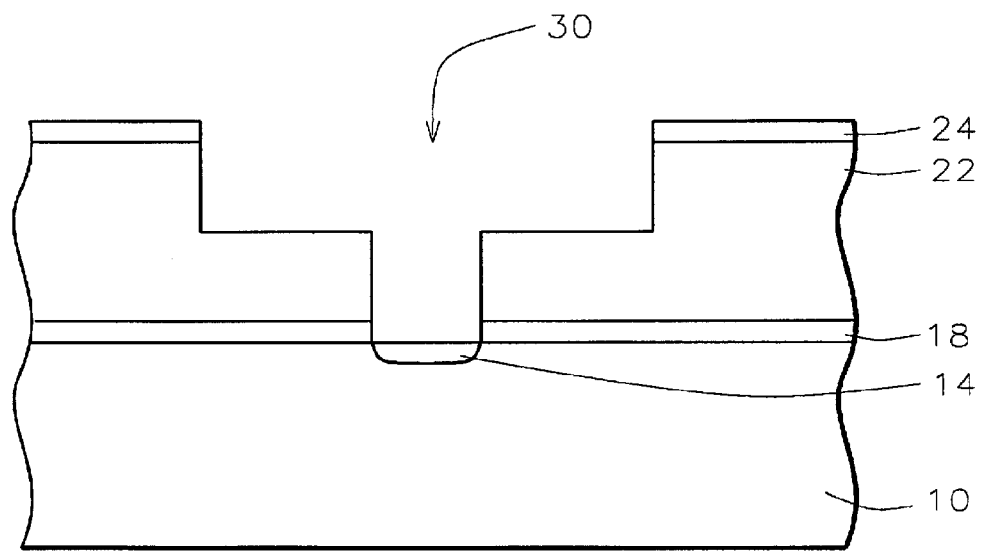

Now, as shown in FIG. 4, the liner layer 18 is etched through where it is exposed within the trench or trench and via 30 using an etch recipe having low pressure to prevent undercutting and isotropic etching, low power to provide a low physical etch component and to prevent re-sputtering of metal within the trench (if 14 is a metal line), and a high F/C ratio etch chemistry to remove the damaged layer at the bottom of the trench to prevent spiking and solvent trapping during subsequent cleaning.

More specifically, the liner layer etching recipe uses etching gases $CF_4$ and $O_2$ or $CHF_3$ and $O_2$. Preferably, $CF_4$ is flowed at 0 to 80 sccm and $O_2$ is flowed at 0 to 50 sccm or $CHF_3$ is flowed at 0 to 80 sccm and $O_2$ is flowed at 0 to 50 sccm. Power is held at between about 250 and 500 watts and pressure is maintained at between about 30 and 70 mTorr.

Now, a wet clean is performed using a fluorine-based solvent, such as TMAH or TMAF, and a low temperature of less than about 50° C. This is a spin-type clean, rather than a conventional wet clean for better cleanability and avoidance of cross-contamination.

Figure 5:
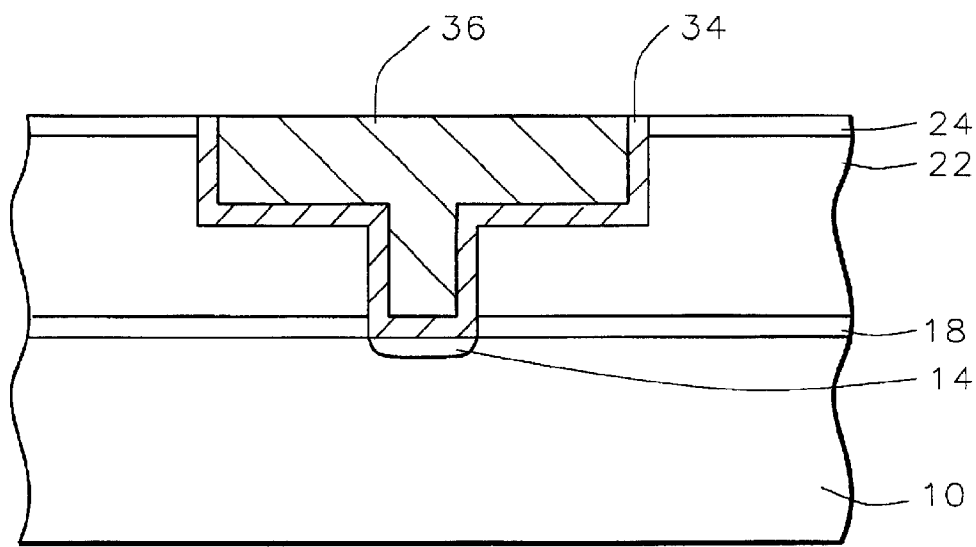

Referring now to FIG. 5, a barrier metal layer 34 is deposited conformally within the damascene opening according to a conventional process. For example, the barrier metal layer may comprise titanium nitride or tantalum nitride deposited by physical vapor deposition (PVD) or chemical vapor deposition (CVD) to a thickness of between about 200 and 300 Angstroms. Then, a metal layer 36 is deposited overlying the barrier metal layer and polished back to complete the metal inlay. For example, metal layer 36 may comprise copper or an aluminum-copper alloy. Processing continues as is conventional in the art to complete fabrication of the integrated circuit device.

The process of the present invention provides a damascene metallization process having excellent electrical properties. An ultra low-k insulating material is used without an etch stop layer resulting in minimal RC delay. The novel etch recipe of the present invention provides a damascene opening without spiking, undercutting, or bowing thereby allowing the formation of a good metal interconnect without metal diffusion into the dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method of forming a damascene opening in the fabrication of an integrated circuit device comprising:
   providing a contact region in or on a substrate;
   depositing a liner layer overlying said contact region;
   depositing a dielectric layer overlying said liner layer wherein all portions of said dielectric layer have a dielectric constant less than 2.5;
   first etching said damascene opening through said dielectric layer to said liner layer overlying said contact region wherein said first etching comprises a high F/C ratio etch chemistry, high power, and low pressure; and
   second etching said liner layer within said damascene opening to expose said contact region wherein said second etching comprises a high F/C ratio etch chemistry, low power, and low pressure to complete formation of said damascene opening in said fabrication of said integrated circuit device.

2. The method according to claim 1 wherein said contact region is a gate electrode, a source region, a drain region, or a metal line.

3. The method according to claim 1 wherein said liner layer is silicon nitride or silicon carbide and has a thickness of between about 300 and 700 Angstroms.

4. The method according to claim 1 wherein said dielectric layer is Black Diamond or organic dielectric materials and has a thickness of between about 6000 and 10,000 Angstroms.

5. The method according to claim 1 wherein said high F/C ratio etch chemistry of said first etching comprises $CF_4$ gas flowed at 0 to 150 sccm, $O_2$ gas flowed at 2 to 20 sccm, and Ar gas flowed at 0 to 300 sccm.

6. The method according to claim 1 wherein said high power of said first etching comprises 700 to 1000 watts.

7. The method according to claim 1 wherein said low pressure of said first etching comprises between about 80 and 150 mTorr.

8. The method according to claim 1 wherein said high F/C ratio etch chemistry of said second etching comprises $CF_4$ gas flowed at 0 to 80 sccm and $O_2$ gas flowed at 0 to 50 sccm.

9. The method according to claim 1 wherein said high F/C ratio etch chemistry of said second etching comprises $CHF_3$ gas flowed at 0 to 80 sccm and $O_2$ gas flowed at 0 to 50 sccm.

10. The method according to claim 1 wherein said low power of said second etching comprises 250 to 500 watts.

11. The method according to claim 1 wherein said low pressure of said second etching comprises between about 30 and 70 mTorr.

12. The method according to claim 1 further comprising:
depositing a barrier metal layer within said damascene opening;
depositing a metal layer overlying said barrier metal layer; and
polishing down said metal layer to leave said metal layer only within said damascene opening.

13. The method according to claim 12 wherein said metal layer is copper or aluminum-copper alloys.

14. A method of forming a damascene opening in the fabrication of an integrated circuit device comprising:
providing a contact region in or on a substrate;
depositing a liner layer overlying said contact region;
depositing a dielectric layer overlying said liner layer wherein said dielectric layer has a dielectric constant of less than 2.5 and wherein no etch stop layer is used within said dielectric layer;
first etching said damascene opening through said dielectric layer to said liner layer overlying said region to be contacted wherein said first etching comprises a high F/C ratio etch chemistry, power of 15 between 700 and 1000 watts, and pressure of between 20 and 150 mTorr and wherein a high polymer gas is not used; and
second etching said liner layer within said damascene opening to expose said region to be contacted wherein said second etching comprises a high F/C ratio etch chemistry, power of between 250 and 500 watts, and pressure of between 30 and 70 mTorr to complete formation of said damascene opening in said fabrication of said integrated circuit device.

15. The method according to claim 14 wherein said contact region is a gate electrode, a source region, a drain regions, or a metal line.

16. The method according to claim 14 wherein said liner layer is silicon nitride or silicon carbide and has a thickness of between about 300 and 700 Angstroms.

17. The method according to claim 14 wherein said dielectric layer is Black Diamond or organic dielectric materials and has a thickness of between about 6000 and 10,000 Angstroms.

18. The method according to claim 14 wherein said high F/C ratio etch chemistry of said first etching comprises $CF_4$ gas flowed at 0 to 150 sccm, $O_2$ gas flowed at 0 to 20 sccm, and Ar gas flowed at 0 to 300 sccm.

19. The method according to claim 14 wherein said high F/C ratio etch chemistry of said second etching comprises $CF_4$ gas flowed at 0 to 80 sccm and $O_2$ gas flowed at 0 to 50 sccm.

20. The method according to claim 14 wherein said high F/C ratio etch chemistry of said second etching comprises $CHF_3$ gas flowed at 0 to 80 sccm and $O_2$ gas flowed at 0 to 50 sccm.

21. The method according to claim 14 further comprising:
depositing a barrier metal layer within said damascene opening;
depositing a metal layer overlying said barrier metal layer; and
polishing down said metal layer to leave said metal layer only within said damascene opening.

22. The method according to claim 21 wherein said metal layer is copper or aluminum-copper alloys.

23. A method of copper metallization in the fabrication of an integrated circuit device comprising:
providing a contact region in or on a substrate;
depositing a liner layer overlying said contact region;
depositing a dielectric layer overlying said liner layer wherein said dielectric layer has a dielectric constant of less than 2.5;
first etching said damascene opening through said dielectric layer to said liner layer overlying said region to be contacted wherein said first etching comprises a high F/C ratio etch chemistry of $CF_4$, $O_2$, and Ar gases, power of between 700 and 1000 watts, and pressure of between 20 and 150 mTorr and wherein a high polymer gas comprising $C_4F_8$, $CH_2F_2$, $C_2F_2$, or $C_2F_6$ is not used;
second etching said liner layer within said damascene opening to expose said region to be contacted wherein said second etching comprises a high F/C ratio etch chemistry, power of between 250 and 500 watts, and pressure of between 30 and 70 mTorr,
depositing a barrier metal layer within said damascene opening;
depositing a copper layer overlying said barrier metal layer; and
polishing down said copper layer and said barrier metal layer to leave said barrier metal layer and said copper layer only within said damascene opening to complete said copper metallization in said fabrication of said integrated circuit device.

24. The method according to claim 23 wherein said contact region is a gate electrode, a source region, a drain regions, or a metal line.

25. The method according to claim 23 wherein said liner layer is silicon nitride or silicon carbide and has a thickness of between about 300 and 700 Angstroms.

26. The method according to claim 23 wherein said dielectric layer is Black Diamond or organic dielectric materials and has a thickness of between about 6000 and 10,000 Angstroms.

27. The method according to claim 23 wherein said high F/C ratio etch chemistry of said first etching comprises $CF_4$ gas flowed at 0 to 150 sccm, $O_2$ gas flowed at 0 to 20 sccm, and Ar gas flowed at 0 to 300 sccm.

28. The method according to claim 23 wherein said high F/C ratio etch chemistry of said second etching comprises $CF_4$ gas flowed at 0 to 80 sccm and $O_2$ gas flowed at 0 to 50 sccm.

29. The method according to claim 23 wherein said high F/C ratio etch chemistry of said second etching comprises $CHF_3$ gas flowed at 0 to 80 sccm and $O_2$ gas flowed at 0 to 50 sccm.

* * * * *